United States Patent [19]

Burns et al.

[11] Patent Number: 5,895,273

[45] Date of Patent: Apr. 20, 1999

[54] SILICON SIDEWALL ETCHING

[75] Inventors: Stuart M. Burns, Ridgefield, Conn.; Hussein I. Hanafi, Goldens Bridge; Waldemar W. Kocon, Wappingers Falls, both of N.Y.; Jeffrey J. Welser, Greenwich, Conn.

[73] Assignee: International Business Machines Corporation, Armonk, N.Y.

[21] Appl. No.: 08/883,762

[22] Filed: Jun. 27, 1997

[51] Int. Cl.$^6$ .................................................. H01L 21/00
[52] U.S. Cl. ...................... 438/719; 438/733; 438/735
[58] Field of Search .............................. 438/711, 712, 438/717, 719, 724, 733, 734, 735; 216/2, 41, 46, 79

[56] References Cited

U.S. PATENT DOCUMENTS

| | | | |
|---|---|---|---|
| 4,450,042 | 5/1984 | Purdes | 156/643 |
| 4,521,275 | 6/1985 | Purdes | 156/643 |
| 4,702,795 | 10/1987 | Douglas | 438/719 X |
| 4,799,991 | 1/1989 | Dockrey | 438/719 |
| 5,078,833 | 1/1992 | Kadomura | 156/643 |
| 5,118,383 | 6/1992 | Engelhardt | 156/643 |
| 5,242,536 | 9/1993 | Schoenborn | 156/643 |
| 5,262,002 | 11/1993 | Grewal et al. | 156/657 |
| 5,271,799 | 12/1993 | Langley | 156/643 |
| 5,409,563 | 4/1995 | Cathey | 156/643 |
| 5,423,941 | 6/1995 | Komura et al. | 156/643.1 |
| 5,665,203 | 9/1997 | Lee et al. | 438/712 X |

OTHER PUBLICATIONS

R.F. Dreves, J.J. Lajza, Jr. and H. Trumpp, :Trench–Forming Process, IBM Technical Dislosure Bulletin, vol. 27, No. 1B, Jun. 1984, pp. 599–600.

S.W. Swan et al., "Microtrenching during polysilicon plasma etch", SPIE, vol. 1803, Apr. 1993, pp. 2–12.

N. Fujiwara et al., "Profile Control of poly–Si Etching in Electron Cyclotron Resonance Plasma", Jap. J. Appl. Phys, vol. 34, Apr. 1995, pp. 2095–2100, Part 1, No. 4B.

H.I. Hanafi et al., "A Scalable Low Power Vertical Memory" IEDM, Dec. 10–13, 1995, pp. 657–660.

*Primary Examiner*—William Powell

[57] ABSTRACT

Decoupled plasma etching process used to make a protruding structure having vertical or near vertical sidewalls. The decoupled plasma etching process comprises the following steps:

forming a mask on top of a semiconductor substrate defining the lateral size of the protruding structures to be formed in said substrate, feeding HCl, $Cl_2$ and $N_2$ into a plasma chamber to provide an ion plasma when applying source power, causing said ions to diffuse towards the substrate by applying a bias power such that the portions of said substrate not being covered by said mask are etched away, wherein the dosage of HCl, $Cl_2$ and $N_2$ is chosen such that newly formed portions of the sidewall surfaces are passivated by by-product of Si, Cl, and $N_2$ and thus become protected from further being etched. The bias power is less than 70 Watts to ensure that the etching process is predominantly chemical.

20 Claims, 11 Drawing Sheets

SILICON SIDEWALL ETCHING

FIELD OF THE INVENTION

The present invention concerns a method for making pillars, or other protruding structures, having sidewalls being vertical or nearly vertical. The inventive process is suited for making dynamic random access memories (DRAMs), logic devices and other kinds of semiconductor circuits and structures.

BACKGROUND OF THE INVENTION

In order to be able to make memory circuits, logic devices and other semiconductor structures of higher integration density than currently feasible, one has to find ways to further scale down certain components thereof and to improve the accuracy at which such components can be made.

For various reasons, vertical channel transistors are more and more used in highly integrated semiconductor structures, such as DRAMs for example. As shown in FIG. 1, a vertical channel transistor 10 typically has a silicon pillar 11 being perpendicular with respect to the substrate 12 on which it is formed. At the bottom of the pillar 11, which serves as channel, a source 13 is situated. The drain 14 is placed at the opposite end of the pillar 11. The gate electrode 15 is separated from the pillar 11 by a thin gate oxide layer 16. Doped polysilicon 17 is deposited adjacent to the gate electrode 15. As indicated in FIG. 1, the gate polysilicon 17 may be connected to the word line of a memory device, and the drain 14 may be connected to a storage device and the bit line (please note that the storage device is not shown in FIG. 1). The etching of the pillar is of utmost importance.

A conventional plasma etch process is described by Purdes in U.S. Pat. No. 4,521,275. Purdes claims to have achieved vertical etching of silicon using a Cl-containing compound such as $BCl_3$. The bromine-bearing species used by Purdes cover the newly etched surfaces not subjected to ion bombardment. Since the bromine is relatively heavy, it attacks and errodes the mask. It is another disadvantage of bromine that it is toxic. Purdes applies high pressure and high power to the etch chamber. The process described is predominantly physical and thus mainly suited for the etching of polysilicon. The selectivity of Purdes' process with respect to the mask is rather low. It is further to be noted that in 1983 decoupled plasma etch system were neither known nor available. Experiments have shown that the disclosed process is not suited for etching silicon sidewalls of high aspect ratio (>1). The uniformity which can be achieved using a process as the one proposed by Purdes is in the range of about 6%.

Other authors and inventors propose $NF_3$ as reactive etchant. This etchant, however, is too aggressive. It attacks almost everything and is non selective. $NF_3$ is thus not suited for etching vertical sidewalls of high aspect ratio.

In the following, various known etch processes are addressed briefly.

U.S. Pat. No. 5,271,799 concerns the vertical etching of an oxide/metal silicide/polysilicon sandwich structure utilizing two bias levels.

U.S. Pat. No. 5,242,536 relates to an etch process which starts off with a so-called initial breakthrough etch using $He/Cl_2$ only. Then HBr is added to etch polysilicon anisotropically.

U.S. Pat. No. 5,078,833 concerns an Electron Cyclotron Resonance (ECR) etching device and $SiCl_4/N_2$ gas mixed with $ClF_3$. The end result achieved with this device and choice of reactant species is a trench with a sidewall protecting layer.

U.S. Pat. No. 4,450,042 concerns a plasma etch chemistry comprising chlorine and bromine which allows to etch almost vertical silicon sidewalls. A wide variety of etchant gas species is disclosed as being suitable.

U.S. Pat. No. 5,262,002 relates to the etching of vertical trench profiles by means of multiple $Si_3N_4$ layers and multiple etch steps along with some sidewall passivation.

U.S. Pat. No. 5,423,941 concerns a plasma etch chemistry at least comprising Br.

U.S. Pat. No. 5,409,563 relates to a glow discharge system operated at elevated temperatures and being suited for the dry etching of high aspect ratio features in silicon.

U.S. Pat. No. 5,118,383 addresses a method for producing trench structures having smooth sidewalls and straight, flat trench floors by etching in a triode single wafer plate reactor using a gas atmosphere exclusively of chlorine.

In the IBM Technical Disclosure Bulletin, Vol. 27, No. 1B, a lift-off process is described which can be used to form a mask with vertical sidewalls. This mask then may be used to etch narrow trenches using reactive ion etching.

In the article "A Scalable Low Power Vertical Memory", H. I. Hanafi et al., IEDM, Dec. 10–13, 1995, pp. 657–660, floating gate vertical transistors are addressed. The pillars are made using an $HCl/Cl_2/N_2$ plasma etch process.

Protruding structures, like pillars, are not only used to form transistors, as shown in FIG. 1, but are also used in connection with various other kinds of devices, such as capacitors, resistors and so forth. For all these applications, it is important that the sidewalls are vertical or nearly vertical and that the sidewall surfaces are even and smooth.

When making vertical FETs, the quality of the sidewall is of particular importance, because an uneven and rough sidewall may cause leakage through the gate oxide and/or the device.

Currently, when etching a silicon substrate to form a protruding structure with vertical or near vertical sidewalls, there are three problems, besides the problem that the sidewall surfaces may not be of sufficient smoothness. Firstly, it is impossible to obtain vertical or near vertical sidewalls of high aspect ratio (heights of vertical sidewall versus width of structure) when using conventional approaches. The sidewalls 20 always are sloped with the angle of slope increasing from about 90° to 80° and less (from top 21 to bottom 22), as schematically illustrated in FIG. 2. Secondly, a foot 23 forms at the bottom of the sidewall 20 and thirdly, a trench 24 appears next to the foot 23, as illustrated in FIG. 2. These effects—known as footing and trenching, respectively—are a function of the chemistry used for etching the protruding structure, the etch time, as well as the micro and macro loading factors. These effects are discussed in the following exemplary articles: "Microtrenching during polysilicon plasma etch", by S. W. Swan et al., Proc. SPIE, Vol. 1803, p. 2–12, 04/1993, and "Profile Control of poly-Si Etching in Electron Cyclotron Resonance Plasma", by N. Rujiwara et al., Jap. J. Appl. Phys, Vol. 34, pp. 2095–2100, Part 1, No. 4B, April 1995.

Trenching, footing and sloped sidewalls are a particular problem in cases where there is no etch-stop layer or a similar means which helps to ensure that the etch step is stopped if the desired etch depth has been reached. Trenching is mainly caused by the focusing of ions along the etched features.

In processes that rely predominantly on the physical mechanisms of sputtering (including RIE), the strongly directional nature of the incident energetic ions allows substrate material to be removed in a highly anisotropic manner, i.e. essentially vertical etch profiles are produced. Unfortunately, such material removal mechanisms are also quite non-selective (also referred to as low selectivity) against both masking material and material underlying the layer being etched. Since in case of the formation of protruding silicon structures on a silicon substrate there is no underlying layer which would serve as etch stop layer, the physical etch process would etch into the substrate thus causing trenching. As a result of these and other drawbacks known to those skilled in the art, etch process based predominantly on the physical removal mechanisms are not suited for the formation of vertical or near vertical sidewalls.

Conventional dry etching processes relying strictly on chemical mechanisms can exhibit very high selectivities against mask materials used. If there is no etch stop layer or the like, as mentioned above, a purely chemical etch step would also etch into the substrate causing trenching and footing. Dry etch processes based on chemical mechanisms typically etch in an isotropic fashion, which is not desired when trying to form vertical or near vertical sidewalls.

When choosing an etch tool and the reactive species for etching a substrate, many factors and parameters have to be taken into consideration:

- the etching process should be highly selective against etching the mask;
- the etching process should allow to form protruding structures of high aspect ratio;
- the etch rate should be rapid, or the throughput of a machine performing the etch should be suitably high;
- the etching should be uniform across the entire wafer, from wafer to wafer, and from run to run;
- the etch process should cause minimal damage to the substrate or other elements formed in previous steps;
- the etch process should be clean (i.e. low incidence of particulate and contamination);
- the etch process should be conducive to full automation and batch fabrication;
- the etch process should be insensitive to the loading factor, or it should be less sensitive than known processes.

There is no etch process known which meets all the above criteria. There is currently no feasible means to precisely control the etching of protruding silicon structures and to fabricate them such that they have vertical or near vertical sidewalls of high aspect ratio.

It is an object of the present invention to provide a method which allows to make protruding silicon semiconductor structures having a vertical or near vertical sidewall.

It is an object of the present invention to provide a method which allows to make protruding silicon structures without causing footing and/or trenching, or with reduced footing and/or trenching.

BRIEF SUMMARY OF THE INVENTION

According to the present invention, a decoupled plasma etching process is used to make a protruding silicon structure having vertical or near vertical sidewalls. This decoupled plasma etching process comprises the following steps:

forming a mask on top of a semiconductor substrate defining the lateral size of the protruding structures to be formed in said substrate, feeding HCl, $Cl_2$ and $N_2$ into a plasma chamber to provide an ion plasma when applying source power, and causing said ions to diffuse towards the substrate by applying a bias power such that the portions of said substrate not being covered by said mask are etched away.

The dosage of HCl, $Cl_2$ and $N_2$ is chosen such that newly formed portions of the sidewall surfaces become passivated by by-product of the etch reactants Si, Cl, and $N_2$. This passivation protects the sidewall surfaces from further being etched. The bias power is adjusted to less than 70 Watts to ensure that the etching process is predominantly chemical.

It is an advantage that the present process is compatible with current semiconductor manufacturing processes.

Further advantages of the inventive process will become obvious form the detailed description and the drawings.

BRIEF DESCRIPTION OF THE DRAWINGS

The invention is described in detail below with reference to the following schematic drawings.

DETAILED DESCRIPTION OF THE INVENTION

The expression "protruding silicon structures" is meant to cover any kind of silicon structure formed on, or in a substrate and having a vertical or near vertical sidewall and an aspect ratio of at least 1, and preferably of at least 1.2. Such a protruding structure may be formed in or on a silicon substrate, or in or on a partially processed silicon substrate comprising other devices, for example.

When referring to a "pillar", any kind of element is meant which protrudes with respect to the surrounding surface of a semiconductor structure. Of particular importance are pillars having sidewalls which are perpendicular or almost perpendicular with respect to the surrounding surface. The aspect ratio of these pillars is at least 1.

Figure 1:
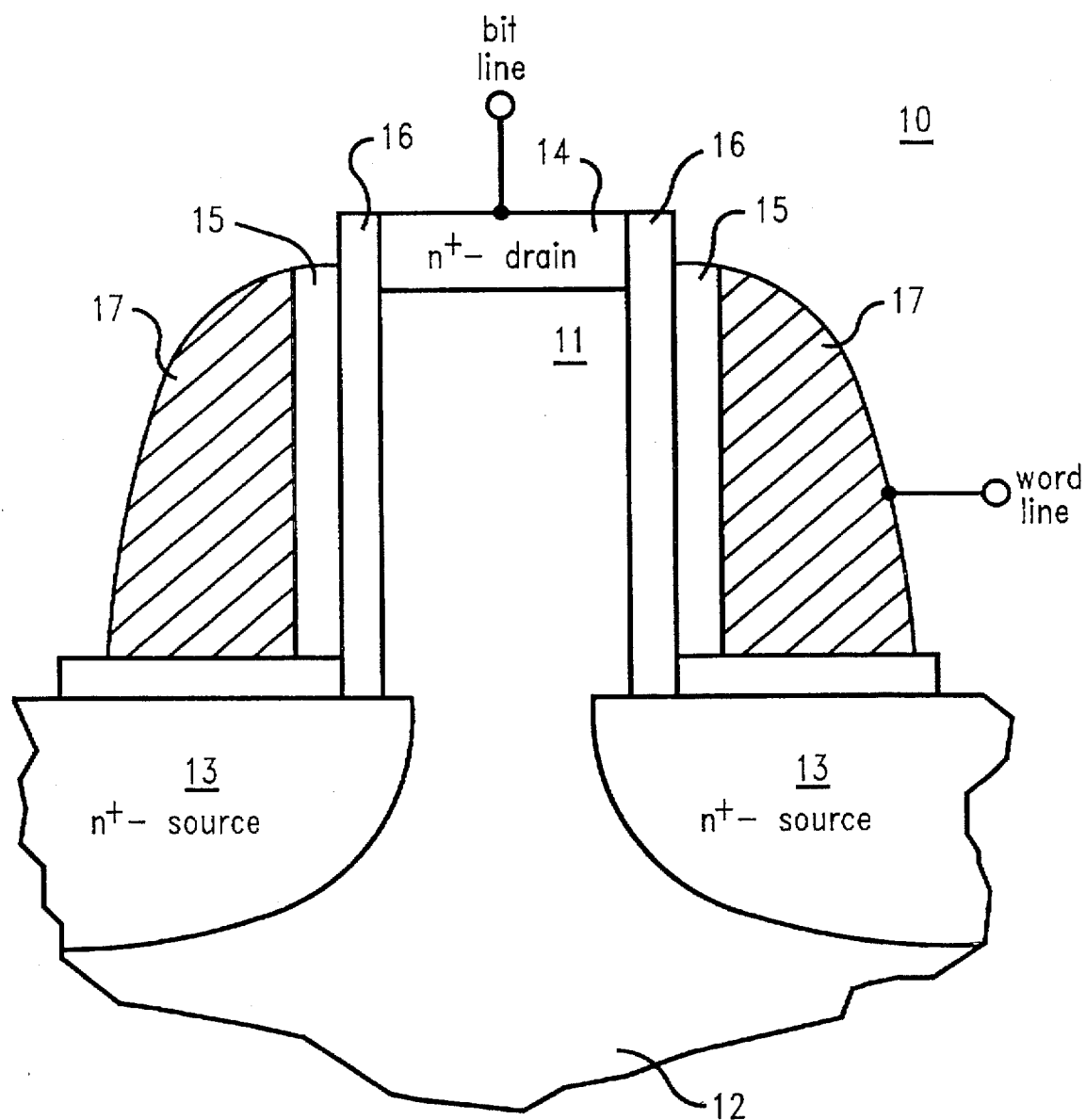
FIG. 1 is a schematic cross section of vertical field effect transistor, as known in the art.

Pillars and other protruding structures, according to the present invention, can be used in many different ways. One example is to use the pillar as part of a vertical FET, as illustrated in FIG. 1.

Before addressing the inventive etch process, a schematic illustration of a conventional etch process is described in connection with FIGS. 4A through 4D. For sake of simplicity, this etch process is shown and described as being a step-by-step process.

Figure 4A:
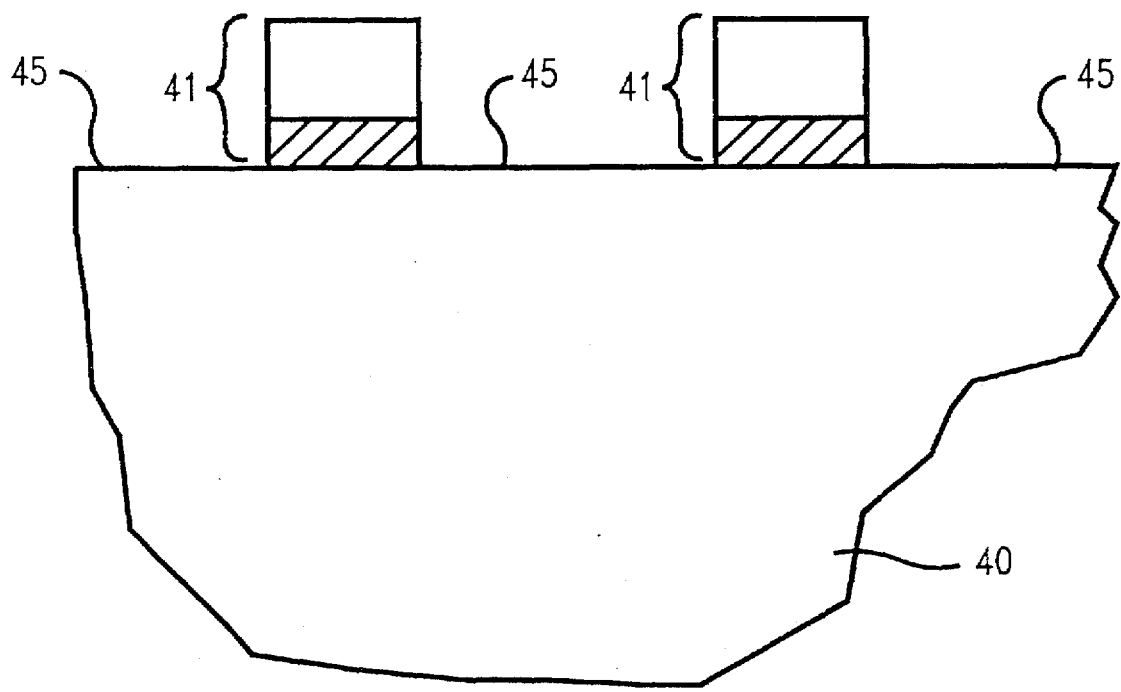
FIGS. 4A–4D is a sequence of Figures schematically illustrating conventional process steps.
Figure 4B:
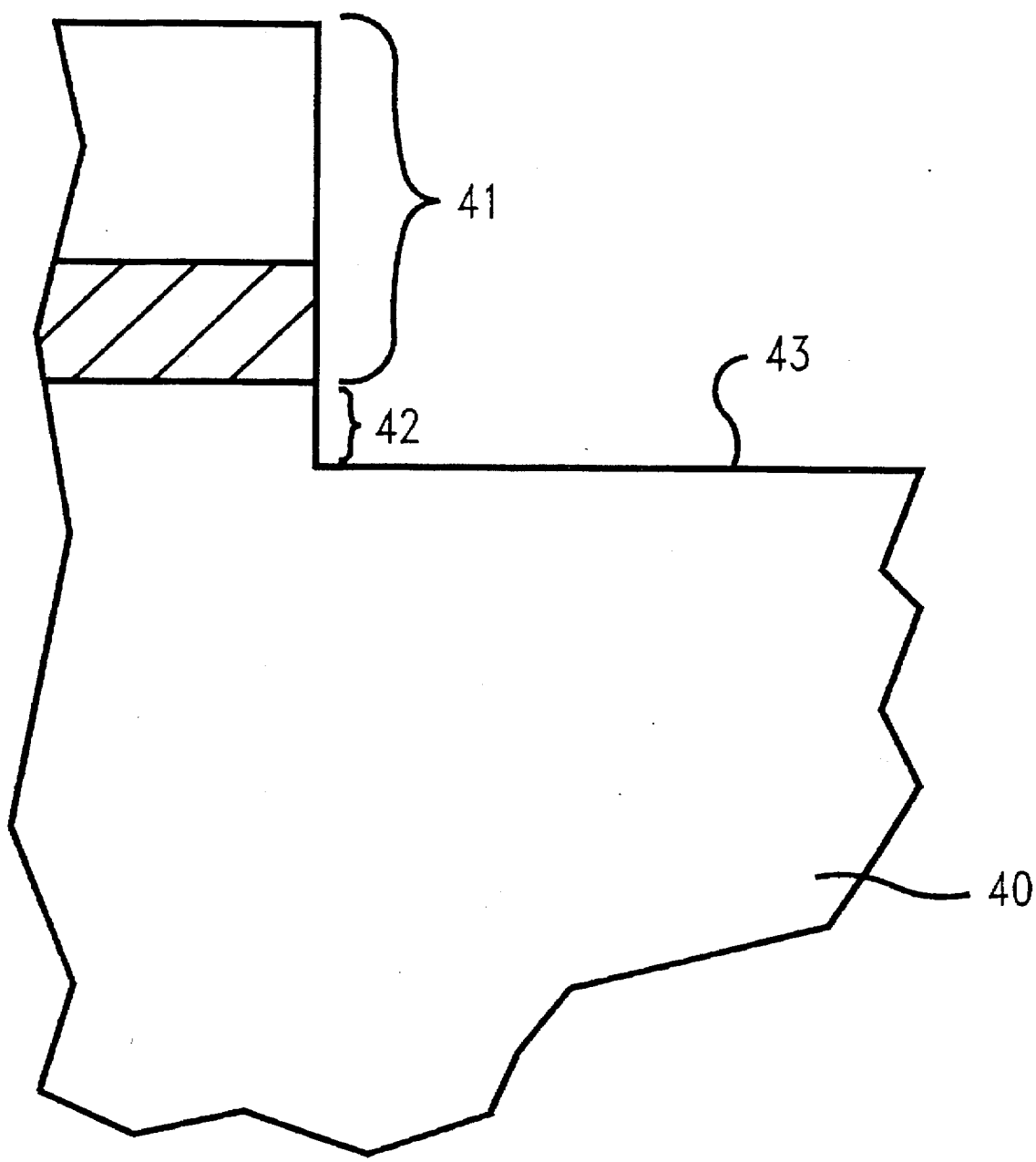

A substrate 40 is shown in FIG. 4A. The lateral shape of the protruding structures to be formed is defined by the lateral shape of a two-layer mask 41. Please note that FIGS. 4B–4D only show a magnified portion of the left part of FIG. 4A. Reactive specimens react with the surface portion 45 of the substrate 40 which is not covered by the mask 41. After the etch time T0 elapsed, part of the substrate 40 has been removed, as schematically illustrated in FIG. 4B. Part of the sidewall 42 to be formed is already visible. During the next etch period T0, more of the substrate 40 is removed.

Figure 4C:
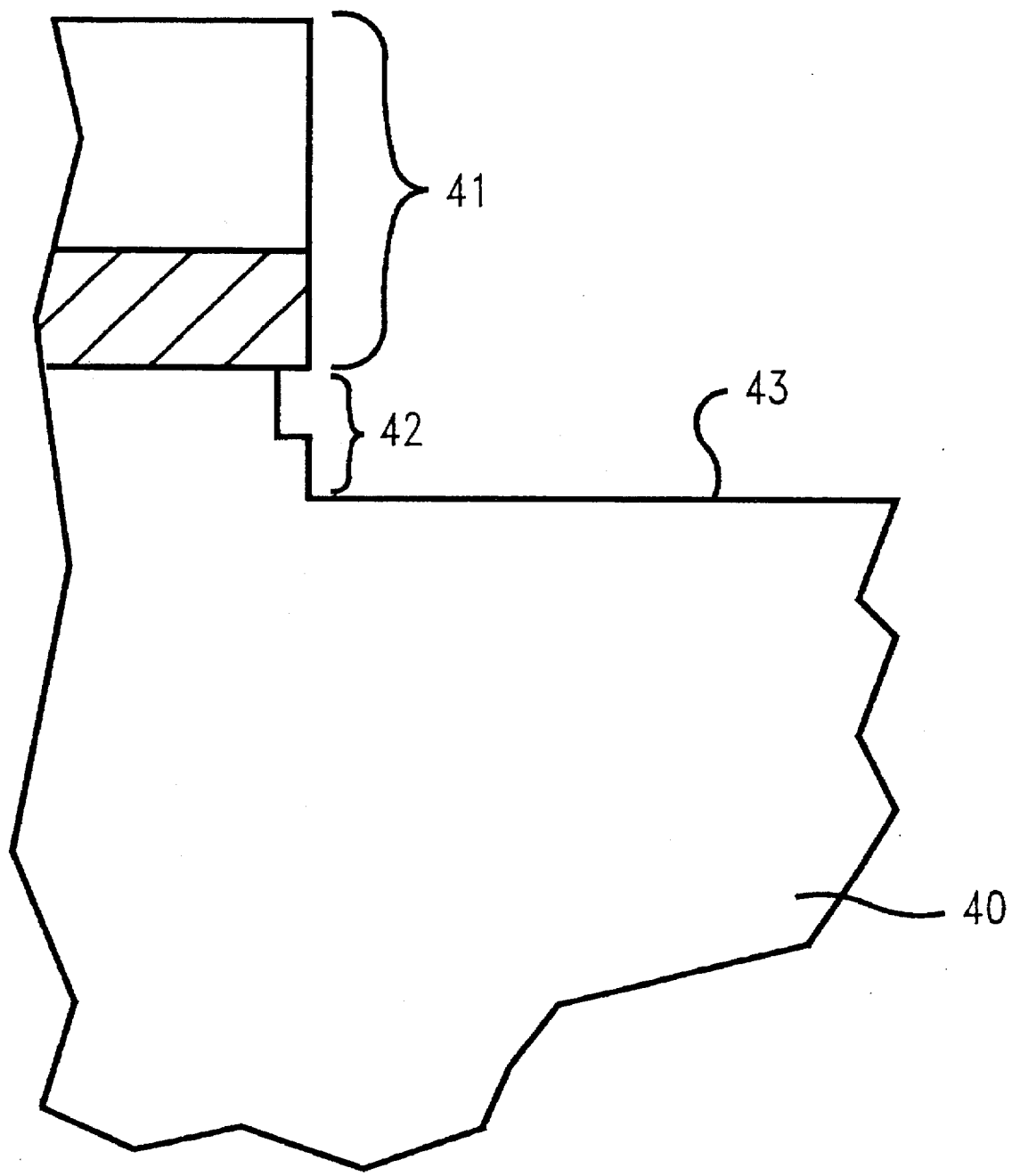
Figure 4:
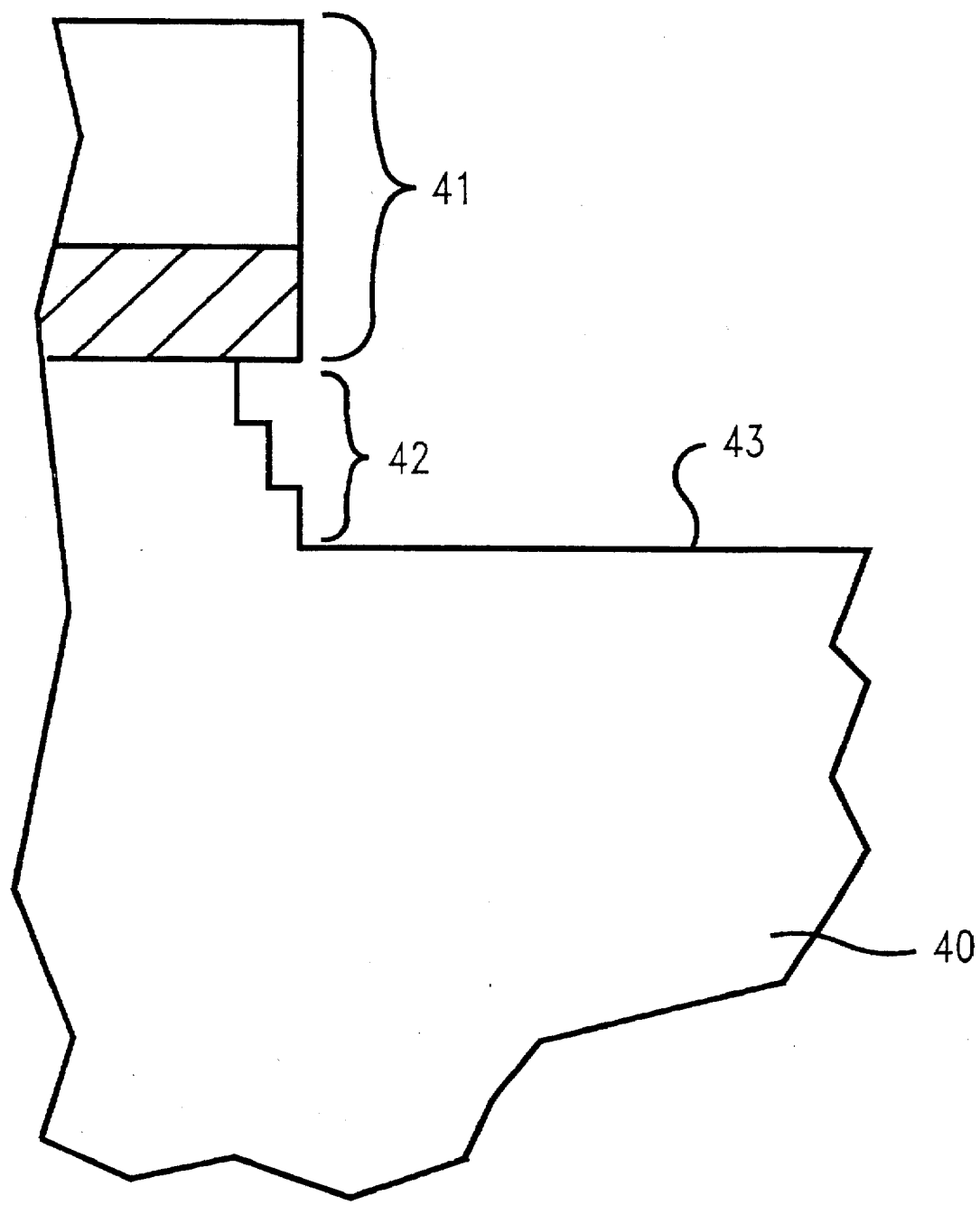

As can be seen in FIG. 4C, not only the substrate material at the surface 43, but also the newly etched sidewall 42 is etched. This effect is schematically illustrated by showing blocks of material getting removed step-by-step. After the etching continues for another period T0, more of the substrate's sidewall gets removed while the surface 43 becomes more and more recessed. This process continues till the etch process is discontinued. Since there is no etch stop layer at which the etch process automatically stops, footing and trenching occurs.

Figure 2:
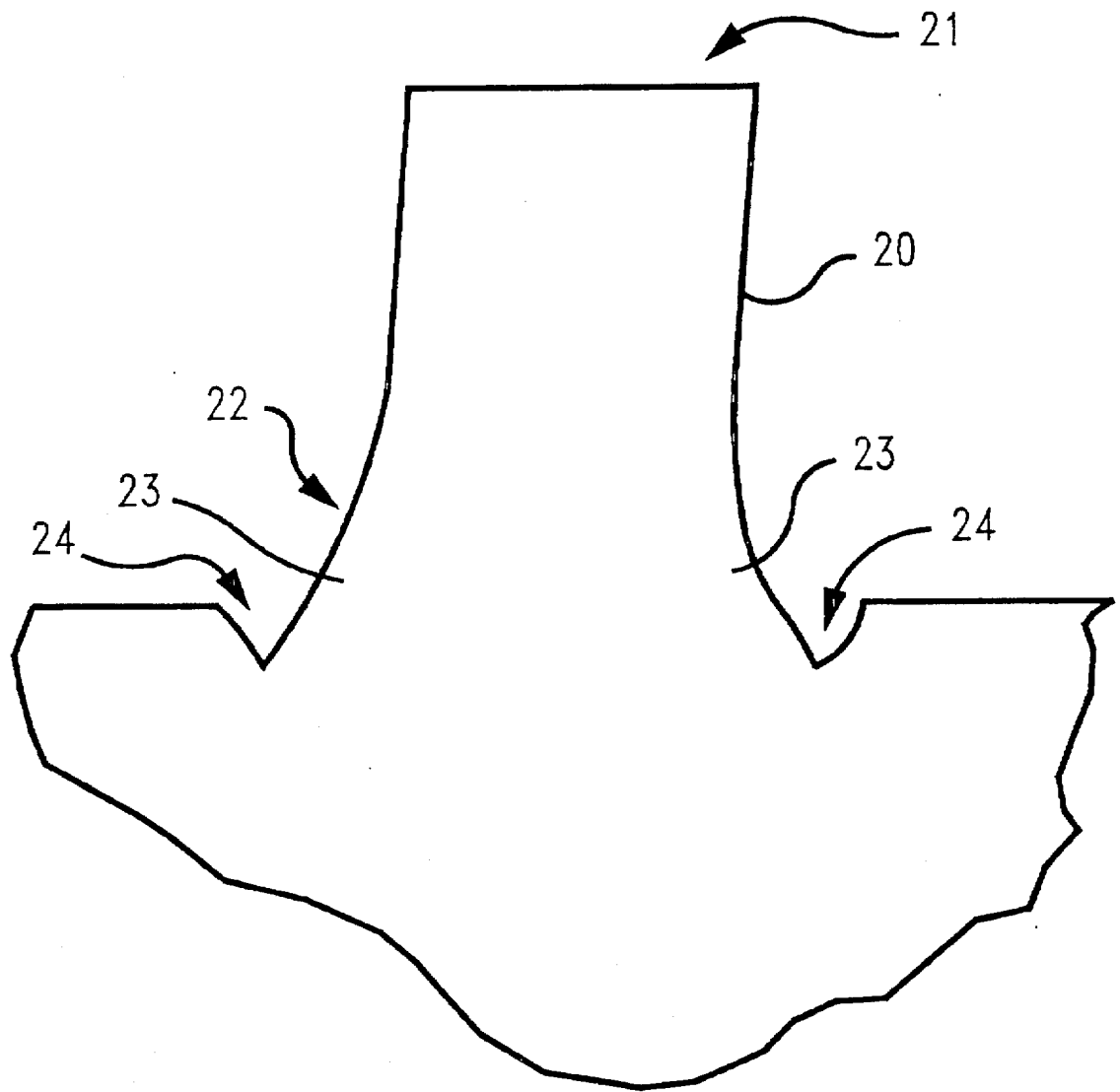
FIG. 2 is a schematic cross section of a high aspect ratio pillar with sloped sidewalls, feet and trenches, made using a conventional plasma etch process.

The result of such a conventional etch process is illustrated in FIG. 2, where the sidewall 20 is sloped. The footing and trenching is also shown in this Figure.

The etch process, according to the present invention, may either be a chemical etch process (e.g. plasma etching) or a combination of a physical etch process and a chemical etch process (e.g. reactive ion etching, RIE, or reactive ion beam etching, RIBE), as long as the chemical component predominates.

In the following, the basic concept of a decoupled plasma etching process is described. First, reactive species are generated in a plasma by feeding suited gases into the chamber of the etch tool and applying a source power. These reactive species (also referred to as ions) then diffuse to the surface of the substrate to be etched. This diffusion is supported by a voltage potential between the plasma and the substrate. This voltage potential is controlled by applying a bias voltage or bias power. The higher this bias voltage is, the more the ions get accelerated and the stronger the physical etching mechanism gets. The ion impingement energy can be adjusted by varying the bias voltage or bias power.

Any kind of plasma etch system can be used which provides for a decoupled plasma, i.e. a plasma where the source power for the generation and maintenance of the plasma can be adjusted separately from the bias voltage/power. When carefully adjusting the bias voltage/power the etch process is predominantly chemical. When referring in the present context to a decoupled plasma etching process, an etch process is meant which is predominantly chemical.

FIRST IMPLEMENTATION:

In the following, the inventive plasma etching process is described by means of a concrete example.

The inventive etch process is now illustrated and described step-by-step. According to the present invention, HCl, $Cl_2$, and $N_2$ are employed for the etching of silicon. Substrate material gets removed block-by-block. In reality, the etch process is a continuous process and not a step-by-step process.

Figure 3A:
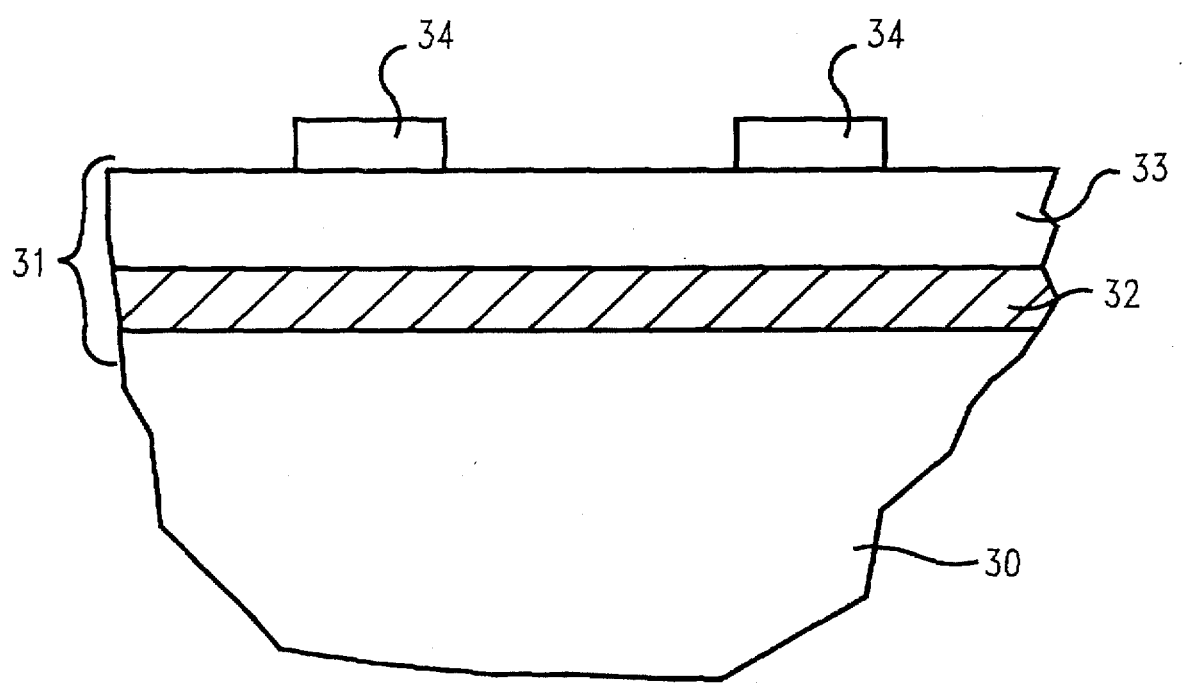
FIGS. 3A–3E is a sequence of Figures schematically illustrating the process steps according to the present invention.

As shown in FIG. 3A, a substrate 30, covered by a two-layer hard mask 31 is provided. The mask 31 consists of an oxide layer 32 which is between 0.005 and 0.03 µm thick, and a $Si_3N_4$ layer 33 which is between 0.08 and 0.2 µm thick. By means of photolithography (not discussed herein) a photoresist pattern 34 is formed on top of layer 33.

Figure 3B:
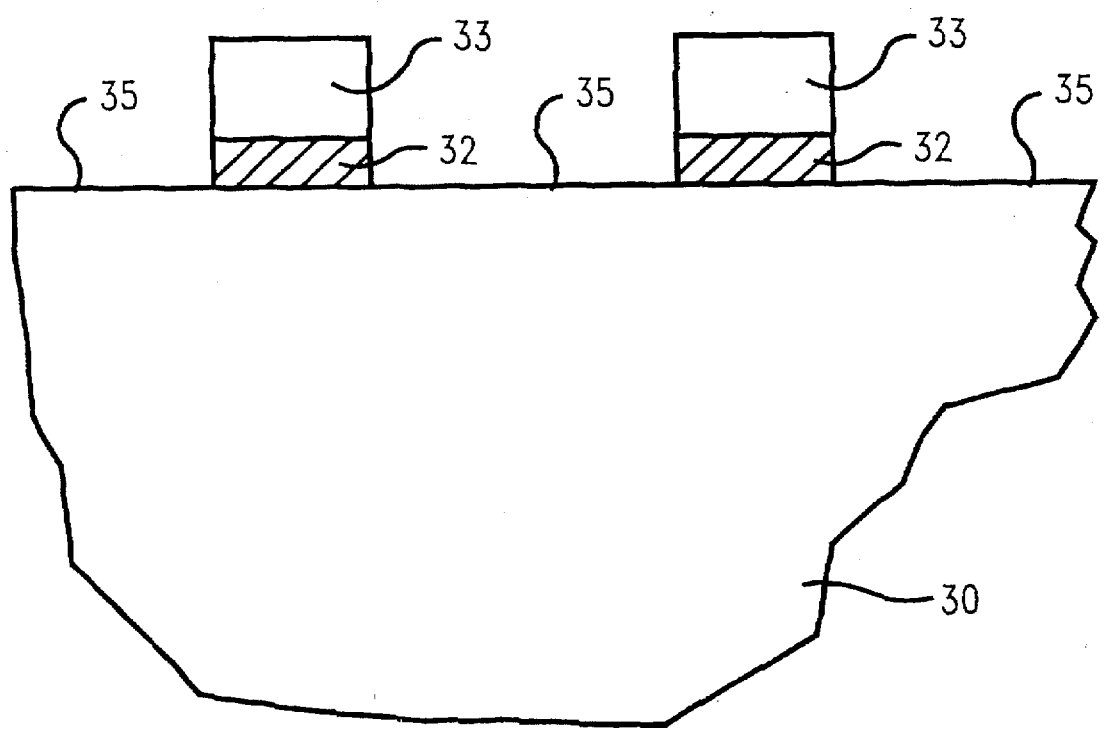

The photoresist pattern 34 is in a next step transferred into the hard mask 31, as shown in FIG. 3B. This can for example be done by dry etching. The hard mask now defines the lateral size of the protruding structures to be formed using the inventive decoupled plasma etch process, as will be described in the following.

According to the first implementation of the present invention a purely or predominantly chemical dry etch process is used.

In a purely or predominantly chemical etch process, the reactive species (ions) are absorbed at the substrate's surface and a chemical reaction occurs with the formation of volatile by-products. These by-products are removed from the substrate and usually diffuse into the bulk of gas. The present etch process is unique in so far as the newly etched sidewall surfaces are immediately 'covered' by a passivation layer, as described in detail in the following.

The reactive species, and in particular the chlorine which is very aggressive and quick, react with the surface portion 35 of the substrate 30 which is not covered by the mask 32, 33. Whenever a portion 36 of the vertical sidewall is newly formed, the by-products of the etch reactants Si, Cl, and $N_2$, passivate this sidewall portion to form a protective layer 37, herein also referred to as passivation layer. The passivation layer 37 is illustrated as hatched boxes.

Figure 3C:
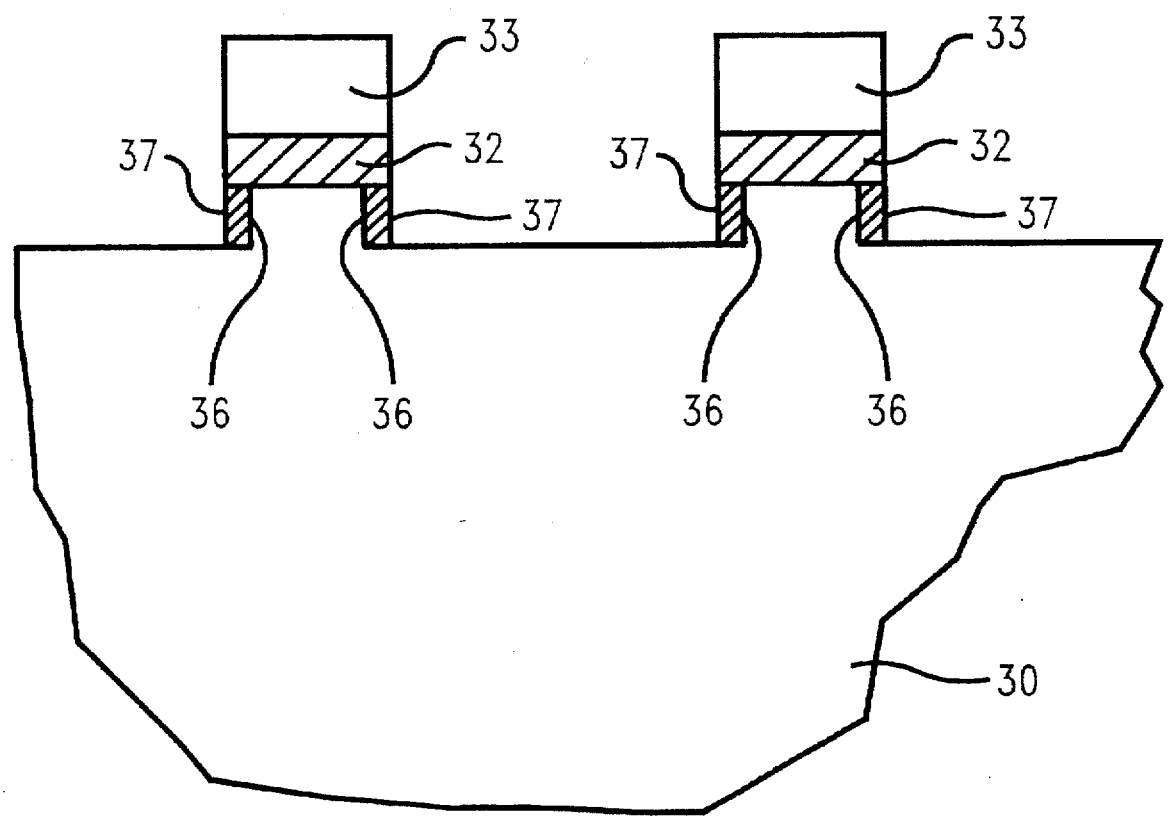
Figure 3D:
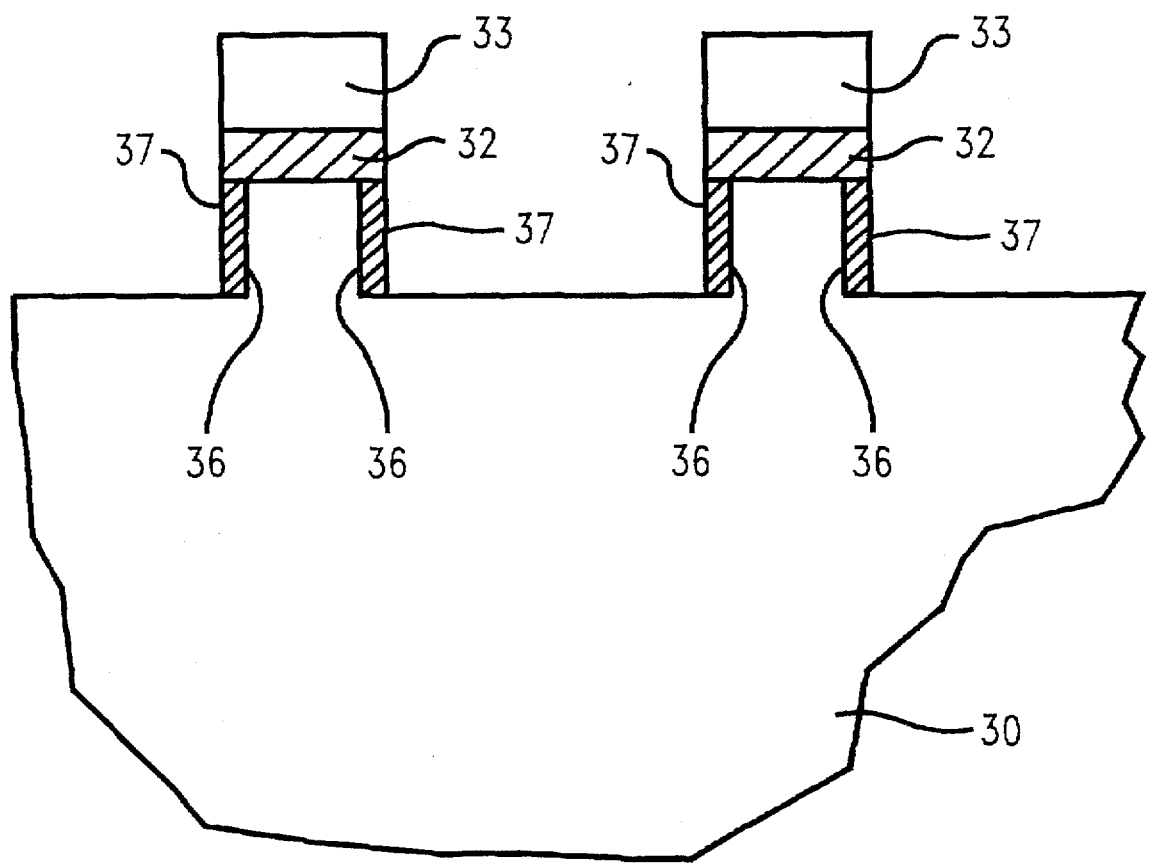
Figure 3E:
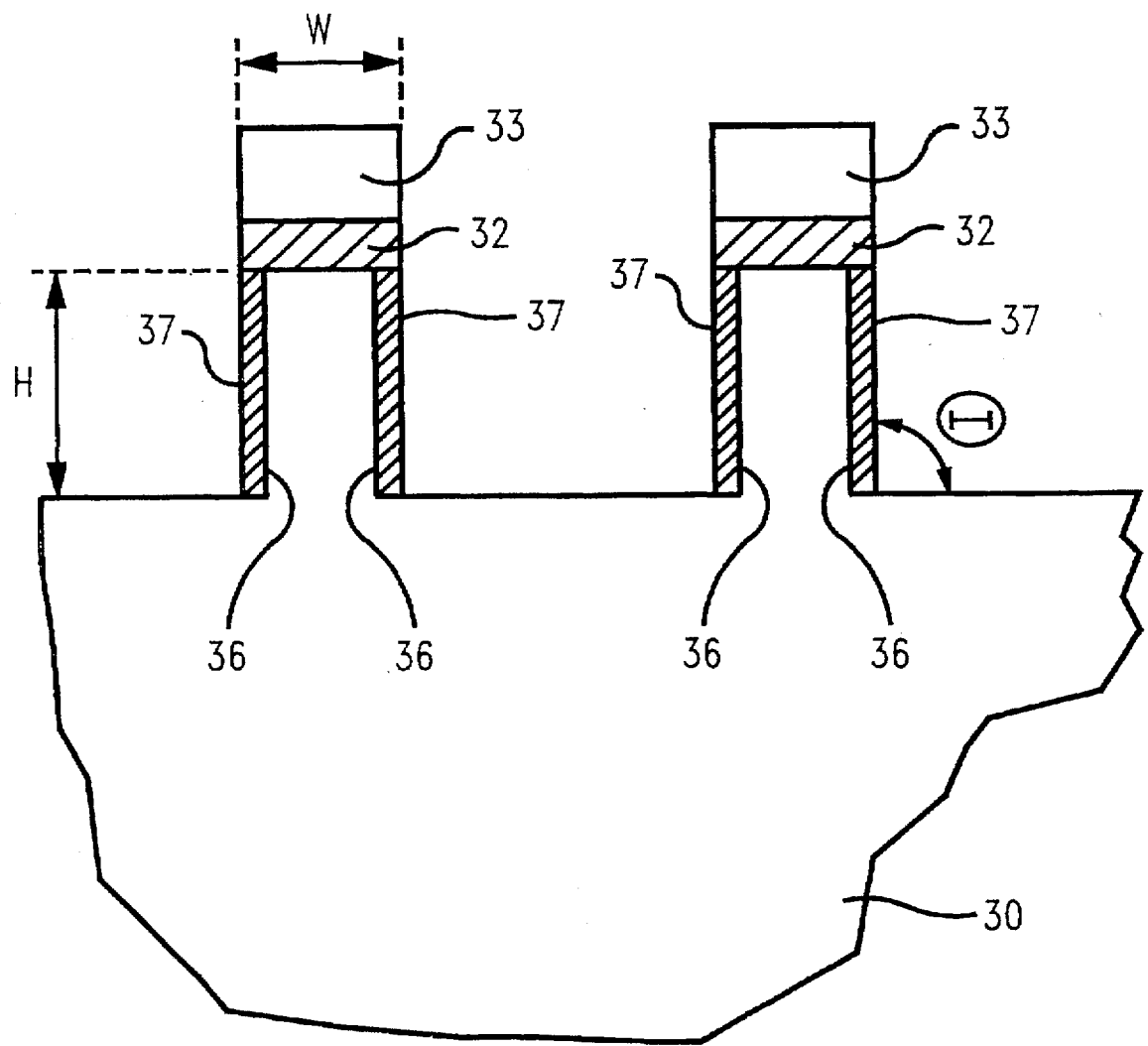

Step-by-step, as shown in FIGS. 3C-3E, the reactive specimens etch into the substrate 30 and newly formed portions 36 of the sidewall surface then get passivated by by-products of the reactants Si, Cl, and $N_2$. The passivation layer 37 prevents newly formed surface 36 from being etched and thus allows to form a vertical or near vertical sidewall 36, as shown in FIG. 3E. When using the inventive etch process, $\Theta$ typically is between 90° and 95°. In the present example, the height of the pillar is H=0.55 µm and the width of the pillar is W=0.4 µm. The aspect ratio (H/W) in the present example is 0.55/0.4=1.375.

Before initiating the actual etch process, an inert gas (e.g. He) may be fed to the backside of the chuck on which the substrate 30 is fixed. He is used for wafer cooling. Well suited is He at a pressure of 8 Torr. The temperature of the chuck is kept at about 37° C. Then, 100 sccm (standard cubic centimeters) HCl, 5 sccm $Cl_2$, and 2 sccm $N_2$ are fed into the chamber to stabilize the gas. With other words, the total gas flow is comprised of about 93% hydrochloric acid (HCl), about 5% Chlorine ($Cl_2$), and about 2% Nitrogen ($N_2$). The gas pressure is adjusted to be 7 mTorr. During this step no power is applied. 20–100 seconds is deemed to be sufficient for the stabilization. Now the actual etching begins by turning on the source power of about 75 W and the bias power of about 30 W. The flow of HCl, $Cl_2$ and $N_2$ may remain the same (100 sccm HCl; 5 sccm $Cl_2$; 2 sccm $N_2$). The duration of the etch step depends on various factors. In the present example, power is applied for about 440 seconds in order to etch silicon pillars of 0.55 µm heights. During this etch process the chuck temperature is kept at 37° C. and the He backside pressure remains 8 Torr. After turning off the source and bias power, one may continue to send He into the chamber for another few seconds. The He backside pressure may still be kept at 8 Torr.

According to the present invention, $Cl_2$ and HCl provide the reactive species by creating a gaseous plasma in a chamber when applying the source power. The flows of HCl, $Cl_2$, and $N_2$, is controlled such that between 90 and 98% of the total gas flow is HCl, and the remaining 10-2% is made up by the $Cl_2$ flow and the $N_2$ flow. Two typical examples are: 100 sccm HCl, 2 sccm $Cl_2$, and 2 sccm $N_2$; or 100 sccm HCl, 5 sccm $Cl_2$, and 2 sccm $N_2$. The Chlorine ions react chemically with the silicon substrate whereas the nitride hard mask is not attacked. I.e., the present combination of reactive species provides for a high selectivity.

Instead of feeding HCl, $Cl_2$ and $N_2$ into the chamber at the same time, one may, for example, first feed HCl and $Cl_2$ into the chamber. Then, after a short period of time, one may add $N_2$ to the gas flow.

Footing as well as trenching is reduced when using the inventive etch chemistry and process.

Since there are no etch stop layers or similar means available in the above described substrates, it is important to terminate a conventional etch process in time to reduce the degree of overetching.

According to the present invention, the newly etched facets are passivated and thus not attacked by reactive species anymore. It is thus less important to control the etch time. One may, however, use end point detection to determine the end point of the inventive etch process. Most of the end point detection approaches are suited for use in connection with the present invention. Examples are described on pages 565–567 of the text book "Silicon Processing for the VLSI Era", Volume 1—Process Technology, S. Wolf and R. N. Tauber, Lattice Press, California, 1986, and in the references cited in this book.

SECOND IMPLEMENTATION:

By adding a physical component to the predominantly chemical etching mechanism (referred to as first implementation), some of the shortcomings of purley chemical mechanisms can be surmounted. Such a combination, as long as the chemical component still dominates, offers the potential of controlled anisotropic etching together with adequate selectivity.

An etch process which is predominantly chemical, but which makes also use of the physical etch mechanism is also referred to as ion-assisted plasma etching process. The main difference between the first implementation and the second implementation is that the bias voltage is higher. Due to the higher bias voltage ions are accelerated from the plasma towards the substrate where physical etching (sputtering) occurs to a certain degree. It is immediately obvious that due to the physical etch component the sidewalls will be slightly more sloped than in case of the first implementation. This second implementation, however, is faster.

It is crucial for the present invention that the plasma comprises HCl, $Cl_2$, and $N_2$. In addition, the plasma may comprise the species Br, C, Ar, He, and F, or any combination thereof.

The inventive process uses a pressure in the range of about 10 mTorr and below. Well suited is a pressure between 5 mTorr and 8 mTorr.

The appropriate bias power (in the art also referred to as RF bias power) depends on the design of the plasma etch tool employed. The bias power (or bias voltage) has to be chosen so as to ensure that the etch process is predominately chemical. In case of a LAM etch chamber (e.g a LAM 9600 which is commercially available from Lam Research Corporation) the bias power is in the range of 5–70 Watts, and preferably between 20 and 40 W.

The source power (also known as top RF power) also depends on the plasma etch tool used. In case of a LAM etch chamber, the source power is in the range of 40–100 Watts, and preferably between 60 and 90 W.

The substrate mounting pedestal is to be maintained at a temperature of about 20° C. to 80° C. Preferably, the temperature is chosen to be in the range of 25–40° C.

It should be noted that during the inventive etch sequence the gas flows may be varied. One may for example ramp the $N_2$ flow from zero to 5 sccm and the $Cl_2$ flow from 100 sccm to 90 sccm. Instead of He other inert gases may be used.

Experiments have revealed that an $Cl_2/N_2$ gas mixture is not suited for the etching of vertical sidewall of high aspect ratio due to the nitride selectivity.

Due to the non-uniformity of any plasma field, vertical surfaces in the middle of a wafer are usually etched more quickly than those vertical surfaces at the edge of the wafer. Since the present invention provides for a passivation of newly etched surface portions, the actual etch time can be adjusted such that the vertical sidewalls at or close to the edge of the wafer are completed before cutting of the etch process without underetching those sidewalls closer to the middle of the wafer.

The Nitrogen used in connection with the passivation of the newly etched sidewalls can be provided from a nitrogen-containing molecule, or as $N_2$. The Nitrogen does not errode the mask used to cover those areas which are not to be etched. It is another advantage of Nitrogen that it is non toxic.

The above two processes are exemplary implementations of the present invention. It is obvious for someone skilled in the art that some of the steps can be modified or carried out differently without deviating from the inventive concept. For example, the etch time, temperature, pressure and other parameters may be changed. The applied power can be ramped up, or altered during the etch process in order to achieve special effects.

None of the conventional fabrication schemes would result in vertical or near vertical sidewalls of slope ($\Theta$) between 90° and 95° and aspect ratio of 1 and more.

The plasma etch process according to the present invention has the following advantages:

- the inventive etch process is highly selective against etching nitride and nitride/oxide masks;
- the etch rate is rapid and the throughput of a plasma etch tool performing the inventive etch is high;
- the etching is uniform across the entire wafer, from wafer to wafer, and from run to run;
- the etch process causes minimal damage to the substrate or other elements formed in previous steps;
- the etch process is clean.
- the etch process is conducive to full automation and batch fabrication.
- the etch process is not nearly as sensitive to the loading factor as known etch processes.

The invention is well suited to shrink the dimension of storage or memory cells without necessitating a proportional lithography shrink. The inventive process can be used to make any kind of discrete semiconductor devices, as well as integrated devices such as very large scale integrated (VLSI) and ultra large scale integrated (ULSI) devices, for example. The inventive method is well suited for making random access memories (RAMs), read only memories (ROMs), erasable programmable read only memories (EPROMs), electrically erasable programmable read only memories (EEPROMs), and programmable logic arrays (PLAs).

We claim:

1. Method for the formation of a protruding silicon structure having vertical or near vertical sidewalls, said method being carried out in a decoupled plasma etching tool and comprising the following steps:

forming a mask on top of a silicon substrate defining the lateral size of the protruding silicon structure, creating an ion plasma from hydrochloric acid (HCl), Chlorine ($Cl_2$), and Nitrogen ($N_2$) in said tool by applying source power, and causing said ions to diffuse towards the silicon substrate by applying a bias power such that the portions of said silicon substrate not being covered by said mask are etched away, wherein the dosage of hydrochloric gas (HCl), Chlorine ($Cl_2$), and Nitrogen ($N_2$) is chosen such that newly formed portions of the sidewall surfaces become passivated and protected from further being etched by by-product of the etch reactants Si, Cl, and $N_2$, and wherein said bias power is less than 70 Watts to ensure that the etching process is predominantly chemical.

2. The method according to claim 1, wherein the total gas flow comprises between 90–98% hydrochloric gas (HCl).

3. The method according to claim 1, wherein the total gas flow is comprised of about 93% hydrochloric gas (HCl), about 5% Chlorine ($Cl_2$), and about 2% Nitrogen ($N_2$).

4. The method according to claim 1, wherein the total gas flow is comprised of about 96% hydrochloric gas (HCl), about 2% Chlorine ($Cl_2$), and about 2% Nitrogen ($N_2$).

5. The method according to claim 1, wherein the source power is in the range of 40–100 Watts, and preferably between 60 and 90 Watts.

6. The method according to claim 1, wherein the bias power is in the range of 5–70 Watts, and preferably between 20 and 40 Watts.

7. The method according to claim 1, wherein the pressure in the tool is kept at about 10 mTorr or below, and preferably between 5 mTorr and 8 mTorr.

8. The method according to claim 1, wherein the Nitrogen ($N_2$) is fed into the tool with a delay.

9. The method according to claim 1, wherein the ion plasma is stabilized before the bias voltage is applied.

10. The method according to claim 1, wherein the the silicon substrate is maintained at a temperature between 20 and 80° C., and preferably between 25 and 40° C.

11. The method according to claim 1, wherein the mask is a hard mask.

12. The method according to claim 11, wherein the hard mask comprises an oxide layer being between 0.005 and 0.03 μm thick.

13. The method according to claim 12, wherein the hard mask further comprises a $Si_3N_4$ layer being between 0.08 and 0.2 μm thick.

14. The method according to claim 1, wherein the aspect ratio (height of sidewall vs. width of protruding silicon structure) is at least 1, and preferably at least 1.2.

15. The method according to claim 1, wherein the protruding silicon structure is a pillar.

16. The method according to claim 15, wherein the pillar is part of a vertical field effect transistor.

17. Method for making a vertical field effect transistor comprising a silicon pillar having vertical or near vertical sidewalls, said method being carried out in a decoupled plasma etching tool and comprising the following steps:

forming a mask on top of a silicon substrate defining the lateral size of the silicon pillar, creating an ion plasma from hydrochloric acid (HCl), Chlorine ($Cl_2$), and Nitrogen ($N_2$) in said tool by applying source power, and causing said ions to diffuse towards the silicon substrate by applying a bias power such that the portions of said silicon substrate not being covered by said mask are etched away, wherein the dosage of hydrochloric gas (HCl), Chlorine ($Cl_2$), and Nitrogen ($N_2$) is chosen such that newly formed portions of the sidewall surfaces become passivated and protected from further being etched by by-product of the etch reactants Si, Cl, and $N_2$, and wherein said bias power is less than 70 Watts to ensure that the etching process is predominantly chemical.

18. The method according to claim 17, wherein the vertical field effect transistor is part of a memory or storage cell.

19. The method according to claim 17, wherein the vertical field effect transistor is part of an EEPROM.

20. The method according to claim 17, wherein the vertical field effect transistor is part of a DRAM memory cell.

* * * * *